United States Patent
Okahisa et al.

(10) Patent No.: US 8,421,190 B2
(45) Date of Patent: Apr. 16, 2013

(54) GROUP III NITRIDE SEMICONDUCTOR SUBSTRATE AND MANUFACTURING METHOD THEREOF

(75) Inventors: Takuji Okahisa, Itami (JP); Hideaki Nakahata, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/899,942

(22) Filed: Oct. 7, 2010

(65) Prior Publication Data

US 2011/0018003 A1 Jan. 27, 2011

Related U.S. Application Data

(62) Division of application No. 11/482,124, filed on Jul. 7, 2006, now abandoned.

(30) Foreign Application Priority Data

Jan. 11, 2005 (JP) ................................. 2005-004142

(51) Int. Cl.
*H01L 29/20* (2006.01)

(52) U.S. Cl.
USPC ............. 257/615; 257/1; 257/609; 257/616; 438/478; 438/510; 117/952

(58) Field of Classification Search ........... 257/E21.097, 257/E21.1, 1, 609, 610, 611, 612, 615, 616; 117/952; 438/478, 510
See application file for complete search history.

(56) References Cited

U.S. PATENT DOCUMENTS

| 6,320,209 | B1 | 11/2001 | Hata et al. |
| 6,455,867 | B2 | 9/2002 | Ogawa |
| 6,544,867 | B1 * | 4/2003 | Webb et al. ................. 438/478 |
| 7,109,049 | B2 | 9/2006 | Takakura et al. |
| 2002/0064195 | A1 * | 5/2002 | Takeya et al. .................. 372/45 |

(Continued)

FOREIGN PATENT DOCUMENTS

| JP | 2-257678 | 10/1990 |
| JP | 10-112438 A | 4/1998 |

(Continued)

OTHER PUBLICATIONS

Japanese Notice of Grounds of Rejection, w/ English translation thereof, issued in Japanese Patent Application No. JP 2005-004142 dated on Dec. 2, 2008.

(Continued)

*Primary Examiner* — Eduardo A Rodela
(74) *Attorney, Agent, or Firm* — McDermott Will & Emery LLP

(57) ABSTRACT

A method of manufacturing a group III nitride semiconductor substrate includes the growth step of epitaxially growing a first group III nitride semiconductor layer on an underlying substrate, and the process step of forming a first group III nitride semiconductor substrate by cutting and/or surface-polishing the first group III nitride semiconductor layer. In the growth step, at least one element selected from the group consisting of C, Mg, Fe, Be, Zn, V, and Sb is added as an impurity element by at least $1 \times 10^{17}$ cm$^{-3}$ to the first group III nitride semiconductor layer. A group III nitride semiconductor substrate having controlled resistivity and low dislocation density and a manufacturing method thereof can thus be provided.

7 Claims, 4 Drawing Sheets (a)

(b)

U.S. PATENT DOCUMENTS

| | | | |
|---|---|---|---|
| 2005/0025205 A1* | 2/2005 | Ryowa et al. | 372/44 |
| 2005/0141577 A1* | 6/2005 | Ueta et al. | 372/43 |
| 2005/0274980 A1 | 12/2005 | Miyoshi | |
| 2006/0011903 A1* | 1/2006 | Yamaguchi et al. | 257/9 |
| 2006/0228584 A1 | 10/2006 | Xu et al. | |
| 2007/0004184 A1* | 1/2007 | Saxler | 438/479 |
| 2007/0040181 A1 | 2/2007 | D'Evelyn et al. | |
| 2007/0158785 A1* | 7/2007 | D'Evelyn et al. | 257/615 |
| 2007/0278622 A1* | 12/2007 | Lester et al. | 257/615 |
| 2008/0008855 A1* | 1/2008 | D'Evelyn et al. | 428/141 |
| 2008/0202409 A1* | 8/2008 | Motoki et al. | 117/84 |
| 2009/0087934 A1* | 4/2009 | Kontani | 438/33 |
| 2010/0267221 A1* | 10/2010 | Sakurai | 438/478 |
| 2010/0278205 A1* | 11/2010 | Ito et al. | 372/45.01 |

FOREIGN PATENT DOCUMENTS

| | | |
|---|---|---|
| JP | 11-26383 A | 1/1999 |
| JP | 2000-68498 A | 3/2000 |
| JP | 2001-102307 A | 4/2001 |
| JP | 2001-148357 | 5/2001 |
| JP | 2001-342100 | 12/2001 |
| JP | 2002-029897 A | 1/2002 |
| JP | 2002-100838 | 4/2002 |
| JP | 2004-059363 A | 2/2004 |

OTHER PUBLICATIONS

Japanese Office Action, with English translation, issued in Japanese Patent Application No. JP 2005-004142, mailed Jun. 17, 2008.

Heikman, S., et al., "Growth of Fe doped semi-insulating GaN by metalorganic chemical vapor desposition", Applied Physics Letters, Jul. 15, 2002, pp. 439-441, vol. 81 No. 3, American Institute of Physics.

Japanese Office Action with English translation issued in application No. 2009-021752 issued on Apr. 10, 2012.

R. Zhang et al., "Photoluminescence of carbon in situ doped GaN grown by halide vapor phase epitaxy", Applied Physics Letters, vol. 72, No. 13, Mar. 30, 1998.

Vaudo et al., "Characteristics of semi-insulating, Fe-doped GaN substrates", Physica Status Solidi A, vol. 200, No. 1, (2003), pp. 18-21.

* cited by examiner (a)  (b)

GROUP III NITRIDE SEMICONDUCTOR SUBSTRATE AND MANUFACTURING METHOD THEREOF

RELATED APPLICATIONS

This application is a Divisional of U.S. patent application Ser. No. 11/482,124, filed on Jul. 7, 2006 now abandoned the entire contents of each of which are hereby incorporated by reference.

BACKGROUND OF THE INVENTION

1. Field of the Invention

The present invention relates to a group III nitride semiconductor substrate having controlled resistivity and low dislocation density and a manufacturing method thereof.

2. Description of the Background Art

In recent years, development of a group III nitride semiconductor substrate suitable as a substrate of various semiconductor devices such as an optical device and an electronic device, that has controlled resistivity, low dislocation density, and stable electric characteristic and/or optical characteristic, has been demanded.

As a method of significantly lowering dislocation density of a group III nitride semiconductor substrate, for example, Japanese Patent Laying-Open No. 2001-102307 (hereinafter, referred to as Patent Document 1) proposes a method of lowering dislocation density in a region other than a dislocation-concentrated region (referred to as low dislocation region here and hereinafter), by concentrating dislocations within crystals in the dislocation-concentrated region in the center portion of a pit by forming and maintaining facets inclosing the pit while crystals of a group III nitride semiconductor are grown on an underlying substrate.

In a GaN substrate obtained with the method according to Patent Document 1, however, the dislocation-concentrated region and the low dislocation region have been present in a mixed manner. In addition, in the low dislocation region as well, a region resulted from growth using the GaN facet as a growth surface (facet growth region) has become a region having low resistivity (low resistivity region), while a region resulted from growth using a GaN C face as a growth surface (C face growth region) has become a region having high resistivity (high resistivity region), and therefore, the low resistivity region and the high resistivity region have been present in a mixed manner. Therefore, in-plane distribution of dislocation density and resistivity of the GaN substrate obtained with the method according to Patent Document 1 has been great.

In addition, Japanese Patent Laying-Open No. 2000-068498 (hereinafter, referred to as Patent Document 2) proposes forming a group III nitride semiconductor layer having high resistivity by adding C (carbon) in high concentration during growth of crystals of a group III nitride semiconductor, while Japanese Patent Laying-Open No. 10-112438 (hereinafter, referred to as Patent Document 3) proposes growth of a p-type group III nitride semiconductor with fewer crystal defects. Moreover, Japanese Patent Laying-Open No. 11-026383 (hereinafter, referred to as Patent Document 4) proposes forming a buffer layer on a substrate, to which C has been added in advance in high concentration, in order to grow a group III nitride semiconductor with fewer crystal defects.

In any of Patent Documents 2 to 4 above, however, control of the resistivity has been difficult, and in-plane distribution of the resistivity has been great. In addition, in the group III nitride semiconductor layer or the group III nitride semiconductor layer substrate in any of Patent Documents 2 to 4 above, the dislocation density thereof cannot be as low as that of the GaN substrate obtained with the method according to Patent Document 1 above, and stability of the electric characteristic and/or optical characteristic has been insufficient.

SUMMARY OF THE INVENTION

An object of the present invention is to provide a group III nitride semiconductor substrate having controlled resistivity and low dislocation density and a manufacturing method thereof.

The present invention is directed to a group III nitride semiconductor substrate containing at least one element selected from the group consisting of C, Mg, Fe, Be, Zn, V, and Sb as an impurity element in concentration of at least $1 \times 10^{17}$ cm$^{-3}$. In the group III nitride semiconductor substrate, in-plane distribution of the concentration of the impurity element represented as a ratio of a maximum concentration to a minimum concentration of the impurity element in a main surface of the substrate is in a range from at least 1 to at most 3. The group III nitride semiconductor substrate has resistivity of at least $1 \times 10^4$ Ω·cm and thickness of at least 70 μm.

In addition, the present invention is directed to a group III nitride semiconductor substrate containing at least one element selected from the group consisting of O, Si, S, Ge, Se, and Te as an impurity element in concentration of at least $1 \times 10^{17}$ cm$^{-3}$. In the group III nitride semiconductor substrate, in-plane distribution of the concentration of the impurity element represented as a ratio of a maximum concentration to a minimum concentration of the impurity element in a main surface of the substrate is in a range from at least 1 to at most 3. The group III nitride semiconductor substrate has resistivity of at most 1 Ω·cm and thickness of at least 70 μm.

In the group III nitride semiconductor substrate according to the present invention, average dislocation density thereof may be not higher than $1 \times 10^7$ cm$^{-2}$, and surface density of a dislocation-concentrated region where dislocation density exceeds $1 \times 10^8$ cm$^{-2}$ may be not higher than 1 cm$^{-2}$; GaN may be employed as the group III nitride; the main surface thereof may be set at an angle in a range from at least $-5°$ to at most $5°$ with respect to any one of a (0001) surface, a (1-100) surface and a (11-20) surface; a half-width of a rocking curve in X-ray diffraction may be in a range from at least 10 arcsec to at most 500 arcsec; carrier density may be not higher than $1 \times 10^{15}$ cm$^{-3}$, or in a range from at least $1 \times 10^{17}$ cm$^{-3}$ to at most $1 \times 10^{20}$ cm$^{-3}$; and absorption coefficient for light of a wavelength of 450 nm may be not smaller than 50 cm$^{-1}$ or not larger than 10 cm$^{-1}$.

The present invention is directed to a method of manufacturing a group III nitride semiconductor substrate including: the growth step of epitaxially growing a first group III nitride semiconductor layer on an underlying substrate; and the process step of forming a first group III nitride semiconductor substrate by cutting and/or surface-polishing the first group III nitride semiconductor layer. In the growth step, at least one element selected from the group consisting of C, Mg, Fe, Be, Zn, V, and Sb is added as an impurity element by at least $1 \times 10^{17}$ cm$^{-3}$ to the first group III nitride semiconductor layer.

The present invention is directed to a method of manufacturing a group III nitride semiconductor substrate including: the growth step of epitaxially growing a second group III nitride semiconductor layer on the first group III nitride semiconductor layer described above; and the process step of forming a second group III nitride semiconductor substrate by cutting and/or surface-polishing the second group III nitride semiconductor layer. In the growth step, at least one element selected from the group consisting of O, Si, S, Ge, Se, and Te is added as an impurity element by at least $1\times10^{17}$ cm$^{-3}$ to the second group III nitride semiconductor layer.

The method of manufacturing a group III nitride semiconductor substrate according to the present invention includes: the growth step of epitaxially growing a third group III nitride semiconductor layer on the first or second, group III nitride semiconductor substrate described above; and the process step of forming a third group III nitride semiconductor substrate by cutting and/or surface-polishing the third group III nitride semiconductor layer. In the growth step, at least one element selected from the group consisting of C, Mg, Fe, Be, Zn, V, and Sb may be added as an impurity element by at least $1\times10^{17}$ cm$^{-3}$ to the third group III nitride semiconductor layer.

In addition, the method of manufacturing a group III nitride semiconductor substrate according to the present invention includes: the growth step of epitaxially growing a fourth group III nitride semiconductor layer on the first or second group III nitride semiconductor substrate described above; and the process step of forming a fourth group III nitride semiconductor substrate by cutting and/or surface-polishing the fourth group III nitride semiconductor layer. In the growth step, at least one element selected from the group consisting of O, Si, S, Ge, Se, and Te may be added as an impurity element by at least $1\times10^{17}$ cm$^{-3}$ to the fourth group III nitride semiconductor layer.

Moreover, in the method of manufacturing a group III nitride semiconductor substrate according to the present invention, any one of a GaAs substrate, a sapphire substrate, an Si substrate, and an SiC substrate, or a group III nitride substrate obtained in a facet growth method may be employed as the underlying substrate. In addition, in the method of manufacturing a group III nitride semiconductor substrate according to the present invention, the growth step may be performed after a mask layer having openings is formed on at least a part of the underlying substrate.

As described above, according to the present invention, a group III nitride semiconductor substrate having controlled resistivity and low dislocation density and a manufacturing method thereof can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
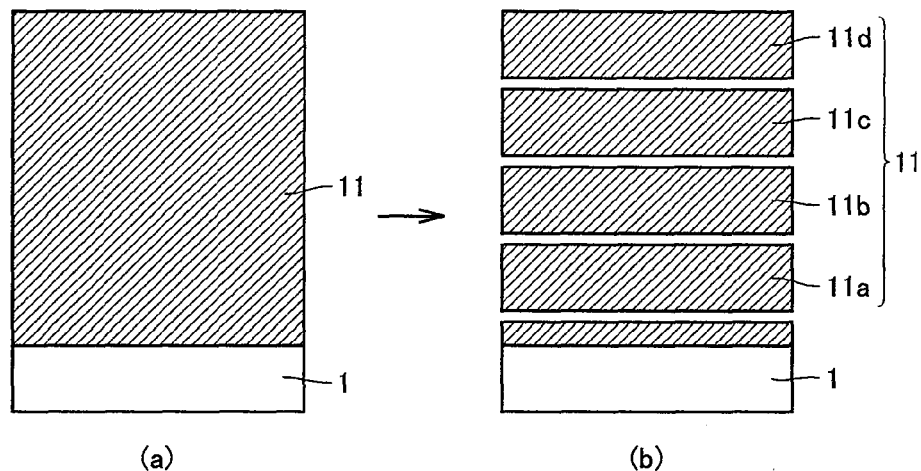
FIG. 1 is a schematic cross-sectional view showing a method of manufacturing a group III nitride semiconductor substrate according to the present invention, and (a) shows the step of growing a group III nitride semiconductor layer and (b) shows the step of processing the group III nitride semiconductor layer.

A group III nitride semiconductor substrate according to the present invention contains at least one impurity element selected from the group consisting of C, Mg, Fe, Be, Zn, V, and Sb as an impurity element in concentration not lower than $1\times10^{17}$ cm$^{-3}$. In the group III nitride semiconductor substrate, in-plane distribution of the concentration of the impurity element represented as a ratio of the maximum concentration to the minimum concentration of the impurity element in the main surface of the substrate is in a range from at least 1 to at most 3. The group III nitride semiconductor substrate has resistivity of at least $1\times10^4$ Ω·cm and thickness of at least 70 μm.

The group III nitride semiconductor substrate contains at least one element from among C, Mg, Fe, Be, Zn, V, and Sb as an impurity element by at least $1\times10^{17}$ cm$^{-3}$, so that in-plane distribution of the concentration of the impurity element (ratio of the maximum concentration to the minimum concentration) in the main surface of the substrate is reduced to a value in a range from at least 1 to at most 3, and a deep acceptor level because of these elements is formed. Therefore, resistivity of the substrate can be controlled to high, that is, at least $1\times10^4$ Ω·cm.

Preferably, in the group III nitride semiconductor substrate in the present embodiment, average dislocation density is at most $1\times10^7$ cm$^{-2}$, and surface density of a dislocation-concentrated region where dislocation density exceeds $1\times10^8$ cm$^{-2}$ is at most 1 cm$^{-2}$. Uniform in-plane distribution of the dislocation density is achieved, so that the electric characteristic and/or optical characteristic stable as the substrate of a semiconductor device can be obtained. The present inventors found that at least one element from among C, Mg, Fe, Be, Zn, V, and Sb added to the group III nitride semiconductor substrate in the present embodiment effectively has a characteristic to suppress generation of dislocation and to mitigate concentration of dislocation during crystal growth, and the present inventors could obtain a group III nitride semiconductor substrate attaining average dislocation density of at most $1\times10^7$ cm$^{-2}$ and surface density of the dislocation-concentrated region where dislocation density exceeds $1\times10^8$ cm$^{-2}$ of at most 1 cm$^{-2}$, by adding at least one element from among C, Mg, Fe, Be, Zn, V, and Sb by at least $1\times10^{17}$ cm$^{-3}$ in growing the group III nitride semiconductor.

Preferably, the group III nitride semiconductor substrate in the present embodiment is implemented by a GaN substrate. The GaN substrate having the resistivity controlled to at least $1\times10^4$ Ω·cm and a thickness not smaller than 70 μm can widely be used as the substrate of the semiconductor device.

The group III nitride semiconductor substrate in the present embodiment preferably has the main surface at an angle in a range from at least −5° to at most 5° with respect to any one of a (0001) surface, a (1-100) surface and a (11-20) surface. On the group III nitride semiconductor substrate having such a main surface, the group III nitride semiconductor layer having excellent crystallinity can be formed, and the semiconductor device having stable electric characteristic and/or optical characteristic can be obtained.

Preferably, the group III nitride semiconductor substrate in the present embodiment has a half-width of a rocking curve in X-ray diffraction in a range from at least 10 arcsec to at most 500 arcsec. On such a group III nitride semiconductor substrate attaining excellent crystallinity, the group III nitride semiconductor layer having excellent crystallinity can be formed, and the semiconductor device having stable electric characteristic and/or optical characteristic can be obtained. In the present embodiment, by adding at least one element from among C, Mg, Fe, Be, Zn, V, and Sb by at least $1 \times 10^{17}$ cm$^{-3}$ to the group III nitride semiconductor substrate, the group III nitride semiconductor substrate attaining a half-width of a rocking curve in X-ray diffraction in a range from at least 10 arcsec to at most 500 arcsec and excellent crystallinity can be obtained.

Preferably, the group III nitride semiconductor substrate in the present embodiment attains the carrier density not higher than $1 \times 10^{15}$ cm$^{-3}$. In the present embodiment, by adding at least one element from among C, Mg, Fe, Be, Zn, V, and Sb by at least $1 \times 10^{17}$ cm$^{-3}$ to the group III nitride semiconductor substrate, the group III nitride semiconductor substrate attaining the carrier density not higher than $1 \times 10^{15}$ cm$^{-3}$ can be obtained, and the resistivity thereof can readily be controlled to at least $1 \times 10^4$ Ω·cm.

Preferably, in the group III nitride semiconductor substrate in the present embodiment, the absorption coefficient for light of a wavelength of 450 nm is at least 50 cm$^{-1}$. In the present embodiment, by adding at least one element from among C, Mg, Fe, Be, Zn, V, and Sb by at least $1 \times 10^{17}$ cm$^{-3}$ to the group III nitride semiconductor substrate, the group III nitride semiconductor substrate attaining the resistivity controlled to at least $1 \times 10^4$ Ω·cm and the absorption coefficient for light of a wavelength of 450 nm of at least 50 cm$^{-1}$ can be obtained.

Embodiment 2

Another group III nitride semiconductor substrate according to the present invention contains at least one element selected from the group consisting of O, Si, S, Ge, Se, and Te as an impurity element in concentration not lower than $1 \times 10^{17}$ cm$^{-3}$. In the group III nitride semiconductor substrate, in-plane distribution of the concentration of the impurity element represented as a ratio of the maximum concentration to the minimum concentration of the impurity element in the main surface of the substrate is in a range from at least 1 to at most 3. The group III nitride semiconductor substrate has resistivity of at most 1 Ω·cm and thickness of at least 70 μm.

The group III nitride semiconductor substrate contains at least one element from among O, Si, S, Ge, Se, and Te as an impurity element by at least $1 \times 10^{17}$ cm$^{-3}$, so that in-plane distribution of the concentration of the impurity element (ratio of the maximum concentration to the minimum concentration) in the main surface of the substrate is reduced to a value in a range from at least 1 to at most 3, and a shallow donor level because of these elements is formed. Therefore, resistivity of the substrate can be controlled to low, that is, at most 1 Ω·cm.

Preferably, as in the case of the group III nitride semiconductor substrate in Embodiment 1, in the group III nitride semiconductor substrate in the present embodiment, average dislocation density is at most $1 \times 10^7$ cm$^{-2}$ and surface density of a dislocation-concentrated region where dislocation density exceeds $1 \times 10^8$ cm$^{-2}$ is at most 1 cm$^{-2}$; the GaN substrate is employed; the main surface thereof is at an angle in a range from at least −5° to at most 5° with respect to any one of a (0001) surface, a (1-100) surface and a (11-20) surface; and a half-width of a rocking curve in X-ray diffraction is in a range from at least 10 arcsec to at most 500 arcsec.

Preferably, the group III nitride semiconductor substrate in the present embodiment attains the carrier density in a range from at least $1 \times 10^{17}$ cm$^{-3}$ to at most $1 \times 10^{20}$ cm$^{-3}$. In the present embodiment, by adding at least one element from among O, Si, S, Ge, Se, and Te by at least $1 \times 10^{17}$ cm$^{-3}$ to the group III nitride semiconductor substrate, the group III nitride semiconductor substrate attaining the carrier density in a range from at least $1 \times 10^{17}$ cm$^{-3}$ to at most $1 \times 10^{20}$ cm$^{-3}$ can be obtained, and the resistivity thereof can readily be controlled to at most 1 Ω·cm.

Preferably, the group III nitride semiconductor substrate in the present embodiment attains the absorption coefficient for light of a wavelength of 450 nm of at most 10 cm$^{-1}$. In the present embodiment, by adding at least one element from among O, Si, S, Ge, Se, and Te by at least $1 \times 10^{17}$ cm$^{-3}$ to the group III nitride semiconductor substrate, the group III nitride semiconductor substrate attaining the resistivity controlled to at most 1 Ω·cm and the absorption coefficient for light of a wavelength of 450 nm of at most 10 cm$^{-1}$ can be obtained.

Embodiment 3

Referring to FIG. 1, a method of manufacturing a group III nitride semiconductor substrate according to the present invention includes: the growth step of epitaxially growing a first group III nitride semiconductor layer 11 on an underlying substrate 1 as shown in FIG. 1(a); and the process step of forming first group III nitride semiconductor substrates 11a, 11b, 11c, and 11d by cutting and/or surface-polishing first group III nitride semiconductor layer 11 as shown in FIG. 1(b). In the growth step, at least one element from among C, Mg, Fe, Be, Zn, V, and Sb is added as an impurity element by at least $1 \times 10^{17}$ cm$^{-3}$ to first group III nitride semiconductor layer 11.

By adding at least one element from among C, Mg, Fe, Be, Zn, V, and Sb as an impurity element by at least $1 \times 10^{17}$ cm$^{-3}$ in epitaxially growing first group III nitride semiconductor layer 11, high-resistivity first group III nitride semiconductor layer 11 and first group III nitride semiconductor substrates 11a, 11b, 11c, and 11d having the resistivity controlled to at least $1 \times 10^4$ Ω·cm can be obtained. In addition, as the impurity element suppresses generation of dislocation and mitigates concentration of dislocation during growth of the first group III nitride semiconductor layer, the group III nitride semiconductor substrate having low dislocation density (for example, the average dislocation density is not higher than $1 \times 10^7$ cm$^{-2}$, and surface density of the dislocation-concentrated region where dislocation density exceeds $1 \times 10^8$ cm$^{-2}$ is not higher than 1 cm$^{-2}$) can be obtained.

Here, the method of growing the group III nitride semiconductor layer is not particularly limited, so long as the method is capable of epitaxially growing the group III nitride semiconductor layer on the underlying substrate. Various vapor deposition methods such as HVPE (hydride vapor phase epitaxy) method, MOCVD (metal-organic chemical vapor deposition) method, and MBE (molecular beam epitaxy) method may be used. From a viewpoint of more efficiently obtaining a thick group III nitride semiconductor substrate (for example, thickness of 70 μm or greater), the HVPE method attaining higher growth rate is more preferred.

The underlying substrate used in the method of manufacturing the group III nitride semiconductor substrate of the present embodiment is not particularly limited, so long as the group III nitride semiconductor layer can epitaxially be grown on the underlying substrate. Here, a GaAs substrate, a sapphire substrate, an Si substrate, or an SiC substrate (particularly, a hexagonal system SiC substrate) is preferably employed. This is because mismatch of the crystal lattice between these substrates and the group III nitride semiconductor is less likely.

From a viewpoint of lower dislocation density of the group III nitride semiconductor layer, the group III nitride substrate obtained in a facet growth method is more preferably employed as the underlying substrate. The reason why the dislocation density of the group III nitride semiconductor layer is lowered will be described in detail below.

Figure 6:
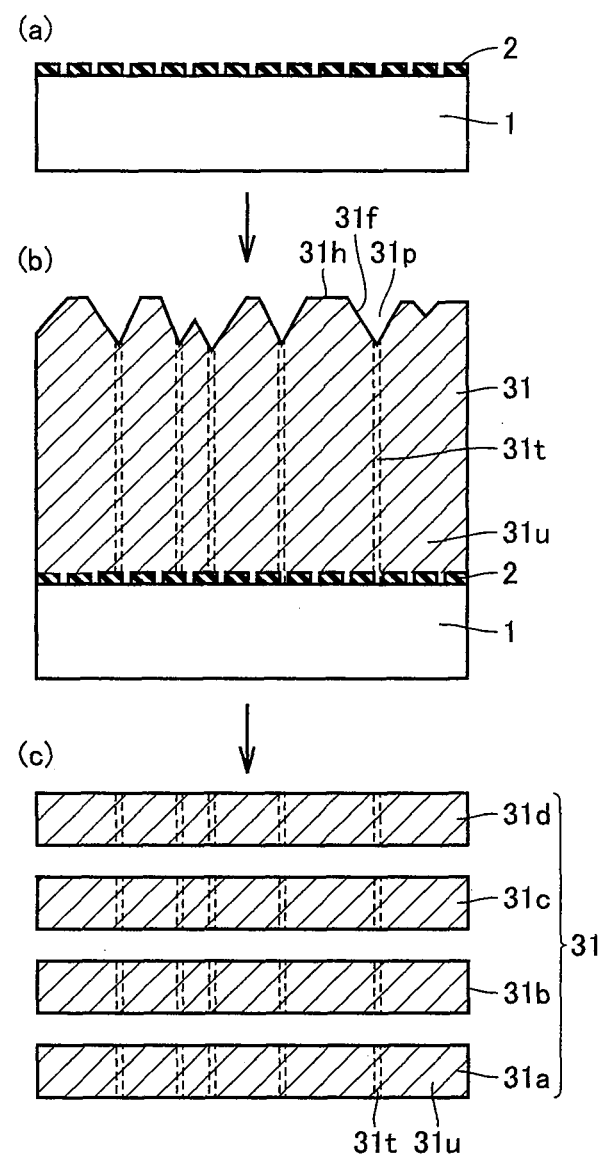
FIG. 6 is a schematic cross-sectional view showing a method of manufacturing a group III nitride semiconductor substrate using a facet growth method, and (a) shows the step of forming a mask layer, (b) shows the step of growing a group III nitride semiconductor layer, and (c) shows the step of processing the group III nitride semiconductor layer.

Here, characteristics of the method of manufacturing the group III nitride semiconductor substrate using the facet growth method and group III nitride substrates 31a, 31b, 31c, and 31d obtained with that method will be described with reference to FIG. 6. Initially, as shown in FIG. 6(a), a mask layer 2 having openings is formed on at least a part of underlying substrate 1, and a group III nitride semiconductor layer 31 is epitaxially grown on underlying substrate 1 through the openings of mask layer 2, as shown in FIG. 6(b). Here, a sapphire substrate, an Si substrate, an SiC substrate, or the like is used as underlying substrate 1, and an $SiO_2$ layer or the like is used as the mask layer. The HVPE method or the like is used as the method of epitaxial growth.

Referring to FIG. 6(b), the facet growth method of the group III nitride semiconductor layer is a method of forming a facet 31f, which is a surface other than a surface (average growth surface 31h) perpendicular to an average growth direction of the group III nitride semiconductor layer, and growing a group III nitride semiconductor layer while maintaining the facet. As a result of crystal growth on facet 31f, dislocation within the group III nitride semiconductor layer is concentrated in a central portion of a pit 31p formed by a plurality of facets 31f, thus forming a dislocation-concentrated region 31t. As the dislocations within the group III nitride semiconductor layer are concentrated in dislocation-concentrated region 31t, the dislocation density in a region (low dislocation region 31u) other than the dislocation-concentrated region is significantly lowered.

Referring next to FIG. 6(c), epitaxially grown group III nitride semiconductor layer 31 is cut to a prescribed thickness and its surface is polished, so as to manufacture group III nitride semiconductor substrates 31a, 31b, 31c, and 31d. Here, dislocation-concentrated region 31t and low dislocation region 31u formed in group III nitride semiconductor layer 31 remain also in group III nitride semiconductor substrates 31a, 31b, 31c, and 31d. In addition, due to the difference in an amount of incorporation of the impurity element, in low dislocation region 31u as well; a region resulted from growth using facet 31f as a growth surface (facet growth region) has become a region having low resistivity (low resistivity region), while a region resulted from growth using average growth surface 31h as a growth surface (average growth surface growth region) has become a region having high resistivity (high resistivity region), and therefore, the low resistivity region and the high resistivity region have been present in a mixed manner. Therefore, it is difficult to control the resistivity of the group III nitride semiconductor substrate obtained with the facet growth method.

Therefore, in order to manufacture the group III nitride semiconductor substrate having controlled resistivity, the group III nitride semiconductor is desirably grown, using as the growth surface, a uniform surface where there is no difference in the amount of incorporation of the impurity element. In other words, in the growth step, the group III nitride semiconductor layer is preferably grown while the average growth surface of the group III nitride semiconductor layer maintains a flat uniform surface. In the present embodiment, it is considered that, by adding at least one element from among C, Mg, Fe, Be, Zn, V, and Sb as the impurity element by at least $1\times10^{17}$ cm$^{-3}$ to the first group III nitride semiconductor layer during epitaxial growth of the first group III semiconductor layer, the group III nitride semiconductor layer can be grown while the average growth surface of the group III nitride semiconductor layer maintains a flat uniform surface, and that lowering in the in-plane distribution of the resistivity in the main surface of the substrate, suppression of generation of the dislocation and/or mitigation of concentration of the dislocation are achieved during epitaxial growth of the first group III nitride semiconductor layer.

Here, paying attention to the fact that the dislocation density of the group III nitride semiconductor substrate obtained with the facet growth method is lower in a portion except for dislocation-concentrated region 31t and the fact that generation of dislocation is suppressed and concentration of the dislocation is mitigated during the growth of the group III nitride semiconductor layer by adding at least one element from among C, Mg, Fe, Be, Zn, V, and Sb as the impurity element by at least $1\times10^{17}$ cm$^{-3}$ in growing the group III nitride semiconductor layer, the present inventors have achieved manufacture of the group III nitride semiconductor substrate having controlled high resistivity and low dislocation density, by using the group III nitride semiconductor substrate obtained with the facet growth method as the underlying substrate and by growing the group III nitride semiconductor layer while adding at least one element from among C, Mg, Fe, Be, Zn, V, and Sb as the impurity element by at least $1\times10^{17}$ cm$^{-3}$ to the group III nitride semiconductor layer.

In other words, even when the group III nitride semiconductor layer is epitaxially grown on the group III nitride semiconductor substrate obtained in the facet growth method and employed as the underlying substrate under the conventional general condition, the group III nitride semiconductor layer takes over the dislocation in the dislocation-concentrated region in the group III nitride semiconductor substrate obtained in facet growth. Therefore, it has been difficult to lower the dislocation density of the group III nitride semiconductor layer.

In contrast, by growing the group In nitride semiconductor layer on the group III nitride semiconductor substrate obtained with the facet growth method and employed as the underlying substrate while adding the impurity element having a characteristic to suppress generation of dislocation and to mitigate concentration of dislocation by at least $1\times10^{17}$ cm$^{-3}$, the group III nitride semiconductor substrate having controlled high resistivity and low dislocation density can be manufactured.

If the underlying substrate used in the method of manufacturing the group III nitride semiconductor substrate of the present embodiment is implemented by hexagonal system crystals, the main surface of the underlying substrate is preferably at an angle in a range from at least −5° to at most 5° with respect to any one of a (0001) surface, a (1-100) surface and a (11-20) surface. If the main surface is implemented as such, the group III nitride semiconductor layer and the group III nitride semiconductor substrate attaining low dislocation density and excellent crystallinity are more likely to be obtained.

In the method of manufacturing the group III nitride semiconductor substrate of the present embodiment, the material for the impurity element is not particularly limited, however, from a viewpoint of easy crystal growth, at least one raw material from among methane ($CH_4$), magnesium chloride (MgCl$_2$ and the like), iron chloride (FeCl$_2$ and the like), beryllium chloride (BeCl$_2$ and the like), zinc chloride (ZnCl$_2$ and the like), vanadium chloride (VCl$_2$ and the like), and antimony chloride (SbCl and the like) is preferably employed. As to magnesium, iron, beryllium, zinc, vanadium, antimony, and the like, a metal of these elements and a hydrochloric gas may be caused to react, so that the resultant gas is used as a raw material.

Embodiment 4

Figure 2:
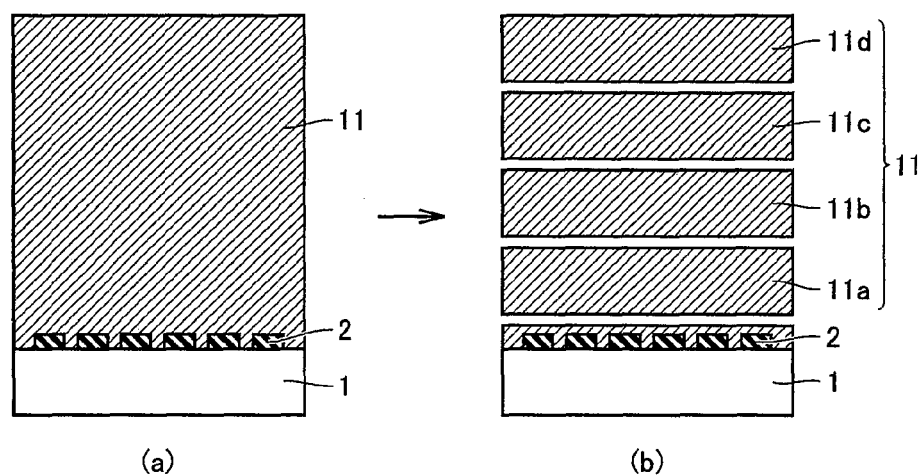
FIG. 2 is a schematic cross-sectional view showing another method of manufacturing a group III nitride semiconductor substrate according to the present invention, and (a) shows the step of growing a group III nitride semiconductor layer and (b) shows the step of processing the group III nitride semiconductor layer.

Referring to FIG. 2, in another method of manufacturing the group III nitride semiconductor substrate according to the present invention, after mask layer 2 having openings is formed on at least a part of underlying substrate 1, the growth step (FIG. 2(a)) and the process step (FIG. 2(b)) the same as in Embodiment 3 are performed. By growing first nitride semiconductor layer 11 on underlying substrate 1 through the openings of mask layer 2, what is called lateral growth is carried out. Accordingly, the dislocation density of first group III nitride semiconductor layer 11 can further be lowered. Here, an SiO$_2$ layer, an Si$_x$N$_y$ layer or the like is used as the mask layer having openings, and it is formed with sputtering, thermal CVD, or the like.

Embodiment 5

Figure 3:
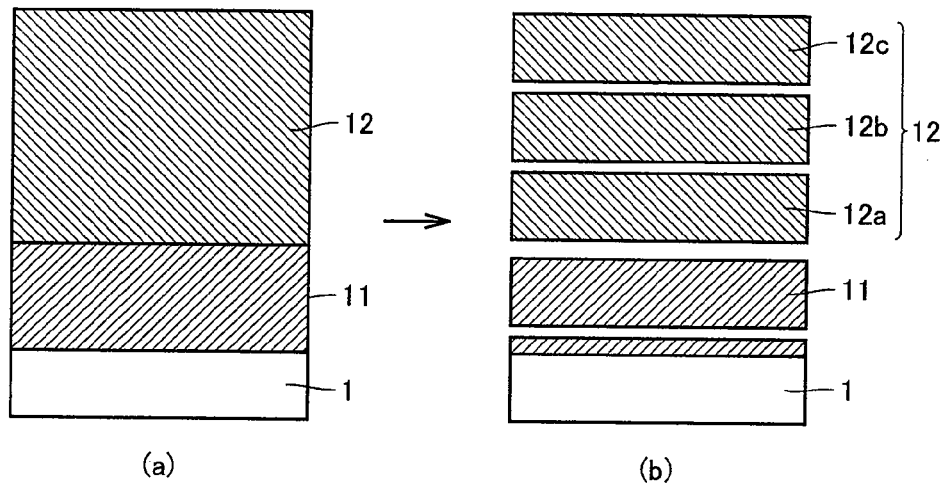
FIGS. 3 to 5 are schematic cross-sectional views showing yet other methods of manufacturing a group III nitride semiconductor substrate according to the present invention, and (a) shows the step of growing a group III nitride semiconductor layer and (b) shows the step of processing the group III nitride semiconductor layer.

Referring to FIG. 3, yet another method of manufacturing a group III nitride semiconductor substrate according to the present invention includes: the growth step of epitaxially growing a second group III nitride semiconductor layer 12 on first group III nitride semiconductor layer 11 that has grown on underlying substrate 1 in Embodiment 3 or 4, as shown in FIG. 3(a); and the process step of forming second group III nitride semiconductor substrates 12a, 12b, and 12c by cutting and/or surface-polishing second group III nitride semiconductor layer 12 as shown in FIG. 3(b). In the growth step, at least one element selected from the group consisting of O, Si, S, Ge, Se, and Te is added as an impurity element by at least $1\times10^{17}$ cm$^{-3}$ to second group III nitride semiconductor layer 12.

By adding at least one element from among O, Si, S, Ge, Se, and Te as an impurity element by at least $1\times10^{17}$ cm$^{-3}$ in epitaxially growing second group III nitride semiconductor layer 12, low-resistivity second group III nitride semiconductor layer 12 and second group III nitride semiconductor substrates 12a, 12b and 12c having the resistivity controlled to at most 1 Ω·cm can be obtained. In addition, as second group III nitride semiconductor layer 12 and second group III nitride semiconductor substrates 12a, 12b and 12c are epitaxially grown on first group III nitride semiconductor layer 11 attaining low dislocation density, the dislocation density thereof is low (for example, the average dislocation density can be not higher than $1\times10^7$ cm$^{-2}$, and surface density of the dislocation-concentrated region where dislocation density exceeds $1\times10^8$ cm$^{-2}$ can be not higher than 1 cm$^{-2}$).

The raw material for the impurity element is not particularly limited in the method of manufacturing the group III nitride semiconductor substrate of the present embodiment, however, from a viewpoint of easy crystal growth, at least one raw material from among oxygen (O$_2$), water (H$_2$O), dichlorosilane (SiH$_2$Cl$_4$), tetrachlorosilane (SiCl$_4$), hydrogen sulfide (H$_2$S), germanium chloride (GeCl$_4$), selenium chloride (SeCl$_4$), and tellurium chloride (TeCl$_4$) is preferably employed. As to germanium, selenium, tellurium, and the like, a metal of these elements and a hydrochloric gas may be caused to react, so that the resultant gas is used as a raw material.

Embodiment 6

Figure 4:
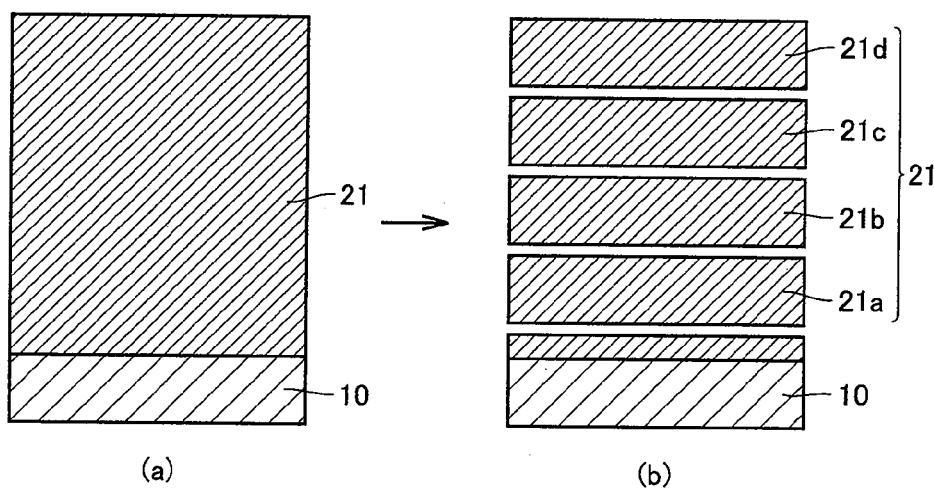

Referring to FIG. 4, yet another method of manufacturing a group III nitride semiconductor substrate according to the present invention includes: the growth step of epitaxially growing a third group III nitride semiconductor layer 21 on a first or second group III nitride semiconductor substrate 10 formed in the manufacturing method in any one of Embodiments 3 to 5, as shown in FIG. 4(a); and the process step of forming third group III nitride semiconductor substrates 21a, 21b, 21c, and 21d by cutting and/or surface-polishing third group III nitride semiconductor layer 21 as shown in FIG. 4(b). In the growth step, at least one element selected from the group consisting of C, Mg, Fe, Be, Zn, V, and Sb is added as an impurity element by at least $1\times10^{17}$ cm$^{-3}$ to third group III nitride semiconductor layer 21.

By adding at least one element from among C, Mg, Fe, Be, Zn, V, and Sb as an impurity element by at least $1\times10^{17}$ cm$^{-3}$ in epitaxially growing third group III nitride semiconductor layer 21, high-resistivity third group III nitride semiconductor layer 21 and third group III nitride semiconductor substrates 21a, 21b, 21c, and 21d having the resistivity controlled to at least $1\times10^4$ Ω·cm can be obtained. In addition, as third group III nitride semiconductor layer 21 and third group III nitride semiconductor substrates 21a, 21b, 21c, and 21d are epitaxially grown on first or second group III nitride semiconductor substrate 10 attaining low dislocation density and as the impurity element having a characteristic to suppress generation of dislocation and to mitigate concentration of dislocation is added by at least $1\times10^{17}$ cm$^{-3}$, the dislocation density thereof is further lowered.

Embodiment 7

Figure 5:
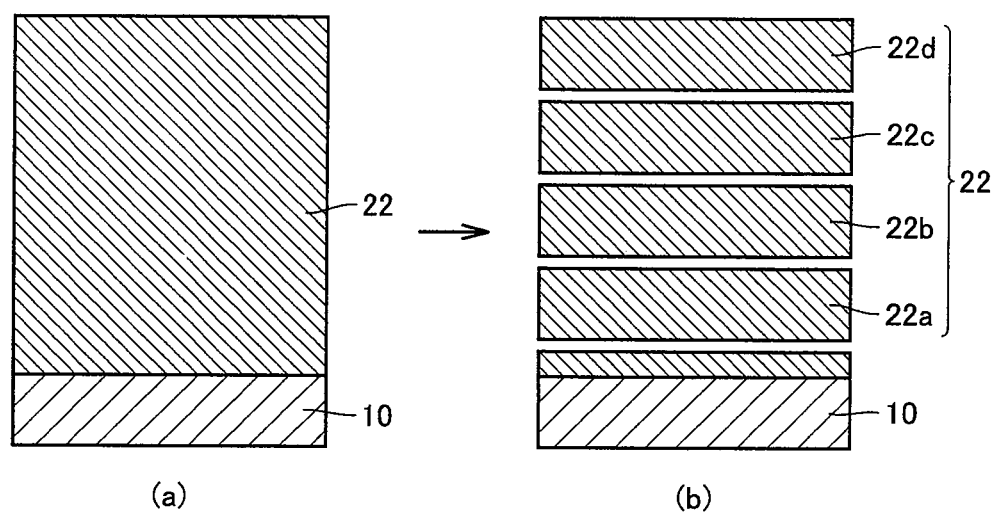

Referring to FIG. 5, yet another method of manufacturing a group III nitride semiconductor substrate according to the present invention includes: the growth step of epitaxially growing a fourth group III nitride semiconductor layer 22 on first or second group III nitride semiconductor substrate 10 formed in the method of manufacturing the group III nitride semiconductor substrate in any one of Embodiments 3 to 5 as shown in FIG. 5(a); and the process step of forming fourth group III nitride semiconductor substrates 22a, 22b, 22c, and 22d by cutting and/or surface-polishing fourth group III nitride semiconductor layer 22 as shown in FIG. 5(b). In the growth step, at least one element selected from the group consisting of O, Si, S, Ge, Se, and Te is added as an impurity element by at least $1\times10^{17}$ cm$^{-3}$ to fourth group III nitride semiconductor layer 22.

By adding at least one element from among O, Si, S, Ge, Se, and Te as an impurity element by at least $1\times10^{17}$ cm$^{-3}$ in epitaxially growing fourth group III nitride semiconductor layer 22, low-resistivity fourth group III nitride semiconductor layer 22 and fourth group III nitride semiconductor substrates 22a, 22b, 22c, and 22d having the resistivity controlled to at most 1 Ω·cm can be obtained. In addition, as fourth group III nitride semiconductor layer 22 and fourth group III nitride semiconductor substrates 22a, 22b, 22c, and 22d are epitaxially grown on first or second group III nitride semiconductor substrate 10 attaining low dislocation density, the dislocation density thereof is low.

Example 1

Referring to FIG. 1(a), the GaN substrate (the main surface of the substrate is at an angle of 1° in a direction of {1-100} surface with respect to (0001) surface) grown with the facet growth method (the method described in Patent Document 1) in the HVPE method was used as underlying substrate 1, and the high-resistivity GaN layer was grown as first group III nitride semiconductor layer 11 to a thickness of 2000 μm, using the HVPE method. A GaCl gas obtained by bringing an HCl gas in contact to gallium metal at 800° C. was used as the Ga source, and an $NH_3$ gas was used as the N source. In addition, a methane gas was used as the impurity element raw material for adding C representing the impurity element. Moreover, an $H_2$ gas was used as the carrier gas.

Here, the condition for epitaxial growth of the GaN layer using the HVPE method was set as follows: growth temperature (temperature of the underlying substrate) of 1050° C.; total pressure of 100 kPa (1.0 atmospheric pressure); partial pressure of $NH_3$ of 20 kPa (0.2 atmospheric pressure); partial pressure of GaCl of 0.5 kPa ($5 \times 10^{-3}$ atmospheric pressure); partial pressure of the impurity element raw material in a range from 0.0001 kPa ($1 \times 10^{-6}$ atmospheric pressure) to 1.0 kPa ($1 \times 10^{-2}$ atmospheric pressure); and the growth time period of 10 hours.

Referring next to FIG. 1(b), the obtained GaN layer was cut in parallel to the main surface of the substrate, and the surface thereof was polished, thus obtaining the high-resistivity GaN substrate having a thickness of 300 μm.

The content of impurity element C in the obtained GaN substrate was measured using SIMS (secondary ion mass spectrometry). The minimum concentration of C was $10^{18}$ $cm^{-3}$, and the in-plane distribution of the concentration of C (maximum concentration/minimum concentration) was 1.5. When the resistivity of the GaN substrate was measured, the resistivity was controlled to at least $1 \times 10^7$ Ω·cm. When the average dislocation density of the GaN substrate was measured with TEM (transmission electron microscope), the average dislocation density was $1 \times 10^6$ $cm^{-2}$. When the surface density of the dislocation-concentrated region (the region where dislocation density exceeds $1 \times 10^8$ $cm^{-2}$; to be understood similarly hereinafter) in the GaN substrate was measured using CL (cathode luminescence), the surface density was not higher than 1 $cm^{-2}$. The half-width of the rocking curve in X-ray diffraction of the GaN substrate was 60 arcsec. When the carrier density of the GaN substrate was evaluated using C (charge)-V (voltage) measurement, the carrier density was not higher than $1 \times 10^{15}$ $cm^{-3}$, and measurement thereof was impossible. When the absorption coefficient for light of a wavelength of 450 nm of the GaN substrate was measured with a spectrophotometer, the absorption coefficient for light was not smaller than 50 $cm^{-1}$. Table 1 summarizes the result.

Example 2

The high-resistivity GaN substrate was obtained in a manner the same as in Example 1, except for using magnesium chloride ($MgCl_2$) as the impurity element raw material. The minimum concentration of impurity element Mg in the obtained GaN substrate was $1 \times 10^{18}$ $cm^{-3}$, the in-plane distribution of the concentration of Mg (maximum concentration/minimum concentration) was 2.5, the resistivity was not lower than $1 \times 10^5$ Ω·cm, the average dislocation density was $1 \times 10^6$ $cm^{-2}$, the surface density of the dislocation-concentrated region was not higher than 1 $cm^{-2}$, the half-width of the rocking curve in X-ray diffraction was 80 arcsec, the carrier density was not higher than $1 \times 10^{15}$ $cm^{-3}$, and the absorption coefficient for light of a wavelength of 450 nm was not smaller than 50 $cm^{-1}$. Table 1 summarizes the result.

Example 3

The high-resistivity GaN substrate was obtained in a manner the same as in Example 1, except for using an iron chloride ($FeCl_2$) gas generated as a result of reaction of iron and hydrochloric gas as the impurity element raw material. The minimum concentration of impurity element Fe in the obtained GaN substrate was $1 \times 10^{18}$ $cm^{-3}$, the in-plane distribution of the concentration of Fe (maximum concentration/minimum concentration) was 2.0, the resistivity was not lower than $1 \times 10^{17}$ Ω·cm, the average dislocation density was $1 \times 10^6$ $cm^{-2}$, the surface density of the dislocation-concentrated region was not higher than 1 $cm^{-2}$, the half-width of the rocking curve in X-ray diffraction was 80 arcsec, the carrier density was not higher than $1 \times 10^{15}$ $cm^{-3}$, and the absorption coefficient for light of a wavelength of 450 nm was not smaller than 50 $cm^{-1}$. Table 1 summarizes the result.

Example 4

Referring to FIG. 2(a), the GaN substrate (the main surface of the substrate is at an angle of 1° in a direction of {1100} surface with respect to (0001) surface) grown with the facet growth method (the method described in Patent Document 1) in the HVPE method was used as underlying substrate 1. The high-resistivity GaN substrate was obtained in a manner the same as in Example 1 after the $SiO_2$ layer having a thickness of 0.1 μm, in which openings each having a size of 2 μm×2 μm were uniformly distributed in a shape like a close-packed structure, was formed as mask layer 2 having openings, on at least a part of the GaN substrate serving as underlying substrate 1. Here, mask layer 2 was obtained by forming the $SiO_2$ layer to a thickness of 0.1 μm using sputtering, and thereafter forming openings each having a size of 2 μm×2 μm with photolithography such that they are uniformly distributed in a shape like a close-packed structure. The minimum concentration of impurity element C in the obtained GaN substrate was $1 \times 10^{18}$ $cm^{-3}$, the in-plane distribution of the concentration of C (maximum concentration/minimum concentration) was 1.5, the resistivity was not lower than $1 \times 10^7$ Ω·cm, the average dislocation density was $1 \times 10^5$ $cm^{-2}$, the surface density of the dislocation-concentrated region was not higher than 1 $cm^{-2}$, the half-width of the rocking curve in X-ray diffraction was 50 arcsec, the carrier density was not higher than $1 \times 10^{15}$ $cm^{-3}$, and the absorption coefficient for light of a wavelength of 450 nm was not smaller than 50 $cm^{-1}$. Table 1 summarizes the result.

Example 5

The high-resistivity GaN substrate was obtained in a manner the same as in Example 4, except for employing a sapphire substrate (the main surface of the substrate is at an angle of 1° in a direction of {1100} surface with respect to (0001) surface) as underlying substrate 1. The minimum concentration of impurity element C in the obtained GaN substrate was $1 \times 10^{18}$ $cm^{-3}$, the in-plane distribution of the concentration of C (maximum concentration/minimum concentration) was 1.5, the resistivity was not lower than $1 \times 10^7$ Ω·cm, the average dislocation density was $1 \times 10^7$ $cm^{-2}$, the surface density of the dislocation-concentrated region was not higher than 1 $cm^{-2}$, the half-width of the rocking curve in X-ray diffraction was 100 arcsec, the carrier density was not higher than $1 \times 10^{15}$ cm$^{-3}$, and the absorption coefficient for light of a wavelength of 450 nm was not smaller than 50 cm$^{-1}$. Table 1 summarizes the result.

Example 6

The high-resistivity GaN substrate was obtained in a manner the same as in Example 4, except for employing a GaAs substrate (the main surface of the substrate is at an angle of 1° in a direction of {011} surface with respect to (111) Ga surface) as underlying substrate 1. The minimum concentration of impurity element C in the obtained GaN substrate was 1×10$^{18}$ cm$^{-3}$, the in-plane distribution of the concentration of C (maximum concentration/minimum concentration) was 1.5, the resistivity was not lower than 1×10$^7$ Ω·cm, the average dislocation density was 2×10$^7$ cm$^{-2}$, the surface density of the dislocation-concentrated region was not higher than 1 cm$^{-2}$, the half-width of the rocking curve in X-ray diffraction was 110 arcsec, the carrier density was not higher than 1×10$^{15}$ cm$^{-3}$, and the absorption coefficient for light of a wavelength of 450 nm was not smaller than 50 cm$^{-1}$. Table 1 summarizes the result.

Example 7

The high-resistivity GaN substrate was obtained in a manner the same as in Example 4, except for employing a 6H—SiC substrate (the main surface of the substrate is at an angle of 1° in a direction of {1-100} surface with respect to (0001) surface) as underlying substrate 1. The minimum concentration of impurity element C in the obtained GaN substrate was 1×10$^{18}$ cm$^{-3}$, the in-plane distribution of the concentration of C (maximum concentration/minimum concentration) was 1.5, the resistivity was not lower than 1×10$^7$ Ω·cm, the average dislocation density was 4×10$^7$ cm$^{-2}$, the surface density of the dislocation-concentrated region was not higher than 1 cm$^{-2}$, the half-width of the rocking curve in X-ray diffraction was 130 arcsec, the carrier density was not higher than 1×10$^{15}$ cm$^{-3}$, and the absorption coefficient for light of a wavelength of 450 nm was not smaller than 50 cm$^{-1}$. Table 1 summarizes the result.

Comparative Example 1

In the GaN substrate grown with the facet growth method (the method described in Patent Document 1) in the HVPE method and used as underlying substrate 1 in Example 1 (the main surface of the substrate is at an angle of 1° in a direction of {1-100} surface with respect to (0001) surface), the minimum concentration of the impurity element was 1×10$^{16}$ cm$^{-3}$, the in-plane distribution of the concentration of the impurity element (maximum concentration/minimum concentration) was 30, the resistivity was 0.01 Ω·cm, the average dislocation density was 1×10$^6$ cm$^{-2}$, the surface density of the dislocation-concentrated region was 500 cm$^{-2}$, the half-width of the rocking curve in X-ray diffraction was 60 arcsec, the carrier density was not higher than 1×10$^{18}$ cm$^{-3}$, and the absorption coefficient for light of a wavelength of 450 nm was not larger than 30 cm$^{-1}$. Table 1 summarizes the result.

TABLE 1

| | | | Example 1 | Example 2 | Example 3 | Example 4 |
|---|---|---|---|---|---|---|
| Underlying substrate | Composition | | GaN | GaN | GaN | GaN |
| | Angle of main surface | | 1° in direction of {1-100} from (0001) surface | 1° in direction of {1-100} from (0001) surface | 1° in direction of {1-100} from (0001) surface | 1° in direction of {1100} from (0001) surface |
| Presence/absence of mask layer | | | absent | absent | absent | present |
| Doping material | | | CH$_4$ | MgCl$_2$ | FeCl$_2$ | CH$_4$ |
| Group III nitride semiconductor substrate | Impurity element | Type | C | Mg | Fe | C |
| | | Minimum concentration (cm$^{-3}$) | 1 × 10$^{18}$ | 1 × 10$^{18}$ | 1 × 10$^{18}$ | 1 × 10$^{18}$ |
| | | In-plane distribution (maximum concentration/minimum concentration) | 1.5 | 2.5 | 2.0 | 1.5 |
| | Resistivity (Ω · cm) | | 1 × 10$^7$ or higher | 1 × 10$^5$ or higher | 1 × 10$^7$ or higher | 1 × 10$^7$ or higher |
| | Average dislocation density (cm$^{-2}$) | | 1 × 10$^6$ | 1 × 10$^6$ | 1 × 10$^6$ | 1 × 10$^5$ |
| | Surface density of dislocation-concentrated region (cm$^{-2}$) | | 1 or lower | 1 or lower | 1 or lower | 1 or lower |
| | Half-width of rocking curve (arcsec) | | 60 | 80 | 80 | 50 |
| | Carrier density (cm$^{-3}$) | | 1 × 10$^{15}$ or lower | 1 × 10$^{15}$ or lower | 1 × 10$^{15}$ or lower | 1 × 10$^{15}$ or lower |
| | Absorption coefficient for light (cm$^{-1}$) | | 50 or larger | 50 or larger | 50 or larger | 50 or larger |

| | | | Example 5 | Example 6 | Example 7 | Comparative Example 1 |
|---|---|---|---|---|---|---|
| Underlying substrate | Composition | | sapphire | GaAs | 6H—SiC | |
| | Angle of main surface | | 1° in direction of {1100} from (0001) surface | 1° in direction of {011} from (111) Ga surface | 1° in direction of {1-100} from (0001) surface | |
| Presence/absence of mask layer | | | present | present | present | |
| Doping material | | | CH$_4$ | CH$_4$ | CH$_4$ | |
| Group III nitride semiconductor | Impurity element | Type | C | C | C | various |
| | | Minimum concentration (cm$^{-3}$) | 1 × 10$^{18}$ | 1 × 10$^{18}$ | 1 × 10$^{18}$ | 1 × 10$^{16}$ |

TABLE 1-continued

| substrate | | | | | |
|---|---|---|---|---|---|
| | In-plane distribution (maximum concentration/ minimum concentration) | 1.5 | 1.5 | 1.5 | 30 |
| | Resistivity (Ω·cm) | $1 \times 10^7$ or higher | $1 \times 10^7$ or higher | $1 \times 10^7$ or higher | 0.01 |
| | Average dislocation density ($cm^{-2}$) | $1 \times 10^7$ | $2 \times 10^7$ | $4 \times 10^7$ | $1 \times 10^6$ |
| | Surface density of dislocation-concentrated region ($cm^{-2}$) | 1 or lower | 1 or lower | 1 or lower | 500 |
| | Half-width of rocking curve (arcsec) | 100 | 110 | 130 | 60 |
| | Carrier density ($cm^{-3}$) | $1 \times 10^{15}$ or lower | $1 \times 10^{15}$ or lower | $1 \times 10^{15}$ or lower | $1 \times 10^{18}$ |
| | Absorption coefficient for light ($cm^{-1}$) | 50 or larger | 50 or larger | 50 or larger | 30 or smaller |

As can clearly be seen from Table 1, by adding at least one element from among C, Mg, Fe, Be, Zn, V, and Sb as the impurity element by at least $1 \times 10^{17}$ $cm^{-3}$ to the group III nitride semiconductor layer in epitaxially growing the group III nitride semiconductor layer on the underlying substrate, the GaN substrate attaining the resistivity controlled to at least $1 \times 10^4$ Ω·cm (preferably, $1 \times 10^7$ Ω·cm), the average dislocation density not higher than $1 \times 10^7$ $cm^{-2}$, the surface density of the dislocation-concentrated region where dislocation density exceeds $1 \times 10^8$ $cm^{-2}$ of at most 1 $cm^{-2}$, the half-width of the rocking curve in X-ray diffraction in a range from at least 10 arcsec to at most 500 arcsec, and the carrier density not higher than $1 \times 10^{15}$ $cm^{-3}$ was obtained.

Example 8

The low-resistivity GaN substrate was obtained in a manner the same as in Example 1, except for employing the high-resistivity GaN substrate (the main surface of the substrate matches with (0001) surface (angle of 0°)) manufactured in Example 1 as underlying substrate 1, employing an oxygen ($O_2$) gas as the impurity element raw material, and setting the partial pressure of the impurity element raw material to 0.001 kPa ($1 \times 10^{-5}$ atmospheric pressure).

The minimum concentration of impurity element O in the obtained GaN substrate was $1 \times 10^{18}$ $cm^{-3}$, the in-plane distribution of the concentration of O (maximum concentration/minimum concentration) was 1.5, the resistivity was 0.010 Ω·cm, the average dislocation density was $1 \times 10^6$ $cm^{-2}$, the surface density of the dislocation-concentrated region was not higher than 1 $cm^{-2}$, the half-width of the rocking curve in X-ray diffraction was 60 arcsec, the carrier density was $1 \times 10^{18}$ $cm^{-3}$, and the absorption coefficient for light of a wavelength of 450 nm was not larger than 5 $cm^{-1}$. Table 2 summarizes the result.

Example 9

The low-resistivity GaN substrate was obtained in a manner the same as in Example 8, except for employing a tetrachlorosilane ($SiCl_4$) gas as the impurity element raw material. The minimum concentration of impurity element Si in the obtained GaN substrate was $1 \times 10^{18}$ $cm^{-3}$, the in-plane distribution of the concentration of Si (maximum concentration/minimum concentration) was 2.5, the resistivity was 0.01 Ω·cm, the average dislocation density was $1 \times 10^6$ $cm^{-2}$, the surface density of the dislocation-concentrated region was not higher than 1 $cm^{-2}$, the half-width of the rocking curve in X-ray diffraction was 60 arcsec, the carrier density was $1 \times 10^{18}$ $cm^{-3}$, and the absorption coefficient for light of a wavelength of 450 nm was not larger than 5 $cm^{-1}$. Table 2 summarizes the result.

Example 10

The low-resistivity GaN substrate was obtained in a manner the same as in Example 8, except for employing a hydrogen sulfide ($H_2S$) gas as the impurity element raw material. The minimum concentration of impurity element S in the obtained GaN substrate was $1 \times 10^{18}$ $cm^{-3}$, the in-plane distribution of the concentration of S (maximum concentration/minimum concentration) was 2.0, the resistivity was 0.02 Ω·cm, the average dislocation density was $1 \times 10^7$ $cm^{-2}$, the surface density of the dislocation-concentrated region was not higher than 1 $cm^{-2}$, the half-width of the rocking curve in X-ray diffraction was 60 arcsec, the carrier density was $7 \times 10^{17}$ $cm^{-3}$, and the absorption coefficient for light of a wavelength of 450 nm was not larger than 10 $cm^{-1}$. Table 2 summarizes the result.

TABLE 2

| | | | Example 8 | Example 9 | Example 10 |
|---|---|---|---|---|---|
| Underlying substrate | Composition | | GaN | GaN | GaN |
| | Angle of main surface | | 0° from (0001) surface | 0° from (0001) surface | 0° from (0001) surface |
| Presence/absence of mask layer | | | absent | absent | absent |
| Doping material | | | $O_2$ | $SiCl_4$ | $H_2S$ |
| Group III nitride semiconductor substrate | Impurity element | Type | O | Si | S |
| | | Minimum concentration ($cm^{-3}$) | $1 \times 10^{18}$ | $1 \times 10^{18}$ | $1 \times 10^{18}$ |
| | | In-plane distribution (maximum concentration/ minimum concentration) | 1.5 | 2.5 | 2.0 |
| | Resistivity (Ω·cm) | | 0.01 | 0.01 | 0.02 |
| | Average dislocation density ($cm^{-2}$) | | $1 \times 10^6$ | $1 \times 10^6$ | $1 \times 10^7$ |

TABLE 2-continued

|  | Example 8 | Example 9 | Example 10 |
|---|---|---|---|
| Surface density of dislocation-concentrated region (cm$^{-2}$) | 1 or lower | 1 or lower | 1 or lower |
| Half-width of rocking curve (arcsec) | 60 | 60 | 60 |
| Carrier density (cm$^{-3}$) | $1 \times 10^{18}$ | $1 \times 10^{18}$ | $1 \times 10^{17}$ |
| Absorption coefficient for light (cm$^{-1}$) | 5 or smaller | 5 or smaller | 10 or smaller |

As can clearly be seen from Table 2, by adding at least one element from among O, Si, S, Ge, Se, and Te as the impurity element by at least $1 \times 10^{17}$ cm$^{-3}$ to the group III nitride semiconductor layer in epitaxially growing the group III nitride semiconductor layer on the underlying substrate, the GaN substrate attaining the resistivity controlled to at most 1 Ω·cm, the average dislocation density not higher than $1 \times 10^7$ cm$^{-2}$, the surface density of the dislocation-concentrated region where dislocation density exceeds $1 \times 10^8$ cm$^{-2}$ of at most 1 cm$^{-2}$, the half-width of the rocking curve in X-ray diffraction in a range from at least 10 arcsec to at most 500 arcsec, and the carrier density in a range from at least $1 \times 10^{17}$ cm$^{-3}$ to at most $1 \times 10^{20}$ cm$^{-3}$ was obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A group III nitride semiconductor substrate containing at least one element selected from the group consisting of O, Si, S, Ge, Se, and Te as an impurity element in concentration of at least $1 \times 10^{17}$ cm$^{-3}$ wherein:
   in-plane distribution of the concentration of said impurity element represented as a ratio of a maximum concentration to a minimum concentration of said impurity element in a main surface of the substrate is in a range from at least 1 to at most 3,
   said group III nitride semiconductor substrate has resistivity of at most 1Ω·cm and thickness of at least 70 μm, and
   said group III nitride semiconductor substrate is epitaxially grown on another group III nitride semiconductor substrate containing at least one element selected from the group consisting of C, Mg, Fe, Be, Zn, V, and Sb as another impurity element in concentration of at least $1 \times 10^{17}$ cm$^{-3}$, wherein:
   in-plane distribution of the concentration of said another impurity element represented as a ratio of a maximum concentration to a minimum concentration of said another impurity element in a main surface of the substrate is in a range from at least 1 to at most 3, and
   said another group III nitride semiconductor substrate has resistivity of at least $1 \times 10^4$ Ω·cm and thickness of at least 70 μm.

2. The group III nitride semiconductor substrate according to claim 1, wherein average dislocation density is at most $1 \times 10^7$ cm$^{-2}$, and surface density of a dislocation-concentrated region where dislocation density exceeds $1 \times 10^8$ cm$^{-2}$ is at most 1 cm$^{-2}$.

3. The group III nitride semiconductor substrate according to claim 1, wherein said group III nitride is GaN.

4. The group III nitride semiconductor substrate according to claim 1, wherein said main surface of said group III nitride semiconductor substrate is at an angle in a range from at least −5° to at most 5° with respect to any one of a (0001) surface, a (1-100) surface and a (11-20) surface.

5. The group III nitride semiconductor substrate according to claim 1, wherein a half-width of a rocking curve in X-ray diffraction is in a range from at least 10 arcsec to at most 500 arcsec.

6. The group III nitride semiconductor substrate according to claim 1, wherein carrier density is in a range from at least $1 \times 10^{17}$ cm$^3$ to at most $1 \times 10^{20}$ cm$^{-3}$.

7. The group III nitride semiconductor substrate according to claim 1, wherein absorption coefficient for light of a wavelength of 450 nm is at most 10 cm$^{-1}$.

* * * * *

UNITED STATES PATENT AND TRADEMARK OFFICE
CERTIFICATE OF CORRECTION

PATENT NO. : 8,421,190 B2
APPLICATION NO. : 12/899942
DATED : April 16, 2013
INVENTOR(S) : Takuji Okahisa et al.

Page 1 of 1

It is certified that error appears in the above-identified patent and that said Letters Patent is hereby corrected as shown below:

On the Title Page:

Please delete Item "(30) Foreign Application Priority Data, JP 2005-004142, January 11, 2005."

Signed and Sealed this
Eighth Day of October, 2013

Teresa Stanek Rea
*Deputy Director of the United States Patent and Trademark Office*